(12) United States Patent
Flachowsky et al.

(10) Patent No.: US 9,269,714 B2
(45) Date of Patent: Feb. 23, 2016

(54) DEVICE INCLUDING A TRANSISTOR HAVING A STRESSED CHANNEL REGION AND METHOD FOR THE FORMATION THEREOF

(71) Applicant: GLOBALFOUNDRIES Inc., Grand Cayman (KY)

(72) Inventors: Stefan Flachowsky, Dresden (DE); Ralf Illgen, Dresden (DE); Gerd Zschaezsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 190 days.

(21) Appl. No.: 13/914,288

(22) Filed: Jun. 10, 2013

(65) Prior Publication Data

US 2014/0361335 A1    Dec. 11, 2014

(51) Int. Cl.
     *H01L 21/84*      (2006.01)
     *H01L 27/092*      (2006.01)
     *H01L 21/8238*      (2006.01)
     *H01L 27/12*      (2006.01)

(52) U.S. Cl.
     CPC ...... *H01L 27/092* (2013.01); *H01L 21/823807* (2013.01); *H01L 21/84* (2013.01); *H01L 27/1203* (2013.01)

(58) Field of Classification Search
     CPC ... H01L 27/092; H01L 21/8238; H01L 21/84; H01L 27/1203; H01L 21/823807
     See application file for complete search history.

(56) References Cited

U.S. PATENT DOCUMENTS

| | | | |
|---|---|---|---|
| 2002/0074598 A1* | 6/2002 | Doyle et al. | 257/345 |
| 2006/0003510 A1* | 1/2006 | Kammler et al. | 438/198 |
| 2006/0094193 A1* | 5/2006 | Horstmann et al. | 438/299 |
| 2006/0166475 A1* | 7/2006 | Mantl | 438/590 |
| 2006/0220127 A1* | 10/2006 | Mantl | 257/347 |
| 2008/0029829 A1* | 2/2008 | Yang et al. | 257/402 |
| 2008/0042211 A1* | 2/2008 | Bhattacharyya et al. | 257/369 |
| 2008/0299733 A1* | 12/2008 | Press et al. | 438/299 |
| 2009/0291540 A1* | 11/2009 | Zhang et al. | 438/229 |
| 2010/0200927 A1* | 8/2010 | Greco et al. | 257/369 |
| 2011/0281409 A1* | 11/2011 | Ellis-Monaghan et al. | 438/229 |
| 2013/0102142 A1* | 4/2013 | Lee et al. | 438/591 |
| 2013/0109145 A1* | 5/2013 | Mieno | 438/305 |
| 2014/0248749 A1* | 9/2014 | Hoentschel et al. | 438/231 |

\* cited by examiner

*Primary Examiner* — Tan N Tran
*Assistant Examiner* — Fazli Erdem
(74) *Attorney, Agent, or Firm* — Amerson Law Firm, PLLC (57) ABSTRACT

A device includes a substrate, a P-channel transistor and an N-channel transistor. The substrate includes a first layer of a first semiconductor material and a second layer of a second semiconductor material. The first and second semiconductor materials have different crystal lattice constants. The P-channel transistor includes a channel region having a compressive stress in a first portion of the substrate. The channel region of the P-channel transistor includes a portion of the first layer of the first semiconductor material and a portion of the second layer of the second semiconductor material. The N-channel transistor includes a channel region having a tensile stress formed in a second portion of the substrate. The channel region of the N-channel transistor includes a portion of the first layer of the first semiconductor material and a portion of the second layer of the second semiconductor material. Methods of forming the device are also disclosed.

21 Claims, 5 Drawing Sheets

DEVICE INCLUDING A TRANSISTOR HAVING A STRESSED CHANNEL REGION AND METHOD FOR THE FORMATION THEREOF

BACKGROUND OF THE INVENTION

1. Field of the Invention

Generally, the present disclosure relates to the field of integrated circuits, and, in particular, to integrated circuits including transistors having a stressed channel region.

2. Description of the Related Art

Integrated circuits include a large number of circuit elements, which include, in particular, field effect transistors. In a field effect transistor, a gate electrode is provided. The gate electrode may be separated from a channel region by a gate insulation layer providing electrical insulation between the gate electrode and the channel region. Adjacent the channel region, a source region and a drain region are provided.

The channel region, the source region and the drain region are formed of a semiconductor material, wherein the doping of the channel region is different from the doping of the source region and the drain region. Depending on an electric voltage applied to the gate electrode, the field effect transistor can be switched between an ON-state and an OFF-state, wherein an electric conductivity of the channel region in the ON-state is greater than an electric conductivity of the channel region in the OFF-state.

For improving the current through the channel region of a field effect transistor in the ON-state, an elastic stress can be provided in the channel region. A tensile stress can increase the mobility of electrons in a semiconductor material such as silicon. Providing a tensile stress in the channel region of an N-channel transistor can thus help improve the conductivity of the channel region, so that a greater current through the channel region in the ON-state of the transistor may be obtained. A compressive stress in a semiconductor material such as silicon can improve the mobility of holes, so that providing a compressive stress in the channel region of a P-channel transistor can help obtain a greater current through the channel region of the P-channel transistor in the ON-state of the transistor.

For providing an elastic stress in the channel regions of the transistors, the channel regions may be provided with a plurality of layers of different semiconductor materials. For example, a layer of silicon/germanium and a layer of silicon may be formed on a substrate base of silicon, for example on a silicon wafer. The layer of silicon/germanium is formed on the silicon substrate base, and the layer of silicon is formed on the layer of silicon/germanium. Silicon/germanium has a greater lattice constant than silicon. Due to the differences of the crystal lattice constants of the materials provided on top of each other, an elastic stress may be created.

As detailed above, for improving the performance of P-channel transistors and N-channel transistors, different types of stress may be required in the channel regions of the P-channel transistors and the N-channel transistors. If the above-mentioned technique for creating stress in the channel regions of transistors is employed, creating different stress in the channel regions of P-channel transistors and N-channel regions may be a problem, since, typically, a global stress in the silicon/germanium layer and/or in the silicon layer, for example, a biaxial stress in the top silicon layer is obtained. Hence, while the elastic stress created by the layers of silicon/germanium and silicon on the silicon substrate base may be beneficial for one type of transistor, it may be less than optimal for the other type of transistor.

The present disclosure provides devices and methods that address the above-mentioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative device disclosed herein includes a substrate, a P-channel transistor and an N-channel transistor. The substrate includes a first layer of a first semiconductor material and a second layer of a second semiconductor material. The second layer is provided on the first layer, and the first and second semiconductor materials have different crystal lattice constants. The P-channel transistor includes a channel region having a compressive stress provided in a first portion of the substrate. The channel region of the P-channel transistor includes a portion of the first layer of the first semiconductor material and a portion of the second layer of the second semiconductor material. The N-channel transistor includes a channel region having a tensile stress that is formed in a second portion of the substrate. The channel region of the N-channel transistor includes a portion of the first layer of the first semiconductor material and a portion of the second layer of the second semiconductor material.

An illustrative method disclosed herein includes providing a substrate. The substrate includes a substrate base, a first layer of a first semiconductor material provided on the substrate base and a second layer of a second semiconductor material provided on the first layer. The first semiconductor material and the second semiconductor material have different crystal lattice constants. An electrically insulating structure having a first opening is formed over the substrate. Ions of a noble gas are implanted into a portion of the substrate through the first opening of the electrically insulating structure. A gate electrode of an N-channel transistor is formed in the first opening of the electrically insulating structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to embodiments disclosed herein, field effect transistors can be formed on a substrate, for example, a semiconductor wafer, that includes layers of different semiconductor materials. For example, a layer of silicon/germanium may be provided on a silicon substrate base, and a layer of silicon may be provided on the layer of silicon/germanium. At the beginning of the process, the top layer of silicon may be substantially unstressed and the layer of silicon/germanium may have a compressive stress. The substrate may be fabricated by a wafer vendor, or it may be manufactured in-house using an epitaxial growth of silicon/germanium and silicon, that may be performed at the same facility where the formation of the field effect transistors is performed.

The present disclosure is not limited to the combination of materials of silicon and silicon/germanium. Alternatively, other combinations of semiconductor stacks (heterostructures) including semiconductor materials having different crystal lattice constants, which will cause stress by lattice mismatch, may be used as a starting material.

In embodiments wherein a layer of silicon/germanium and a layer of silicon are provided on a silicon substrate base, a thickness of the top silicon layer may be in a range from about 10-80 nm, a thickness of the buried silicon/germanium layer may be in a range from about 50-200 nm, and the silicon/germanium layer may have a germanium content in a range from about 20-40%, wherein the germanium content is given as a molar fraction of germanium in the silicon/germanium layer.

A high-k metal gate (HKMG) replacement gate process may be performed for forming a P-channel transistor and an N-channel transistor. A P-channel transistor element and an N-channel transistor element may be formed at the substrate. Each of the P-channel transistor element and the N-channel transistor element may include a dummy gate. An interlayer dielectric (ILD) fill may be performed. The interlayer dielectric may include silicon dioxide that is deposited by means of a chemical vapor deposition process and/or a plasma-enhanced chemical vapor deposition process, wherein tetraethyl orthosilicate (TEOS) is used as a reactant. A chemical mechanical polishing process may be used for planarizing the interlayer dielectric and for exposing the dummy gates of the P-channel transistor element and the N-channel transistor element. Then, the dummy gates may be removed.

Thereafter, helium may be implanted into the N-channel transistor element with an energy that may be in a range from about 80-200 keV (depending on the thicknesses of the layers of silicon and silicon/germanium) so that a majority, or at least a substantial amount, of the helium atoms are implanted into the silicon/germanium layer and/or below the silicon/germanium layer, well into the silicon substrate base. A typical dose range of the helium ions may be from about $10^{15}$-$10^{16}$ atoms/cm$^2$.

Thereafter, a thermal treatment, for example an ultra-fast annealing including a laser annealing or a flash lamp annealing, may be performed in order to segregate the helium atoms, which can rearrange and form micro-holes, which disturbs the silicon lattice. This may allow the silicon/germanium layer in the N-channel transistor element to relax from its compressively stressed state by formation of some dislocation defects. At the same time, the top silicon layer, which was unstressed so far, may obtain a tensile stress because of the relaxation of the underlying silicon/germanium layer. This tensile stress may improve the mobility of electrons in the channel region of the N-channel transistor and, thus, improve the drive current of the N-channel transistor.

The P-channel transistor element may be masked during the implantation of the helium ions, so that the helium ions are implanted only into the N-channel transistor element. Thus, the compressive stress of the silicon/germanium layer that may be helpful for improving the mobility of holes in the channel region of the P-channel transistor element may be maintained in the P-channel transistor element.

Thereafter, a deposition of a high-k gate insulation layer and a deposition of a metal may be performed, wherein different metals may be used for the N-channel transistors and the P-channel transistors, depending on work function requirements of the transistors. Additionally, a formation of contacts and a back end of line may be performed.

Figure 1:
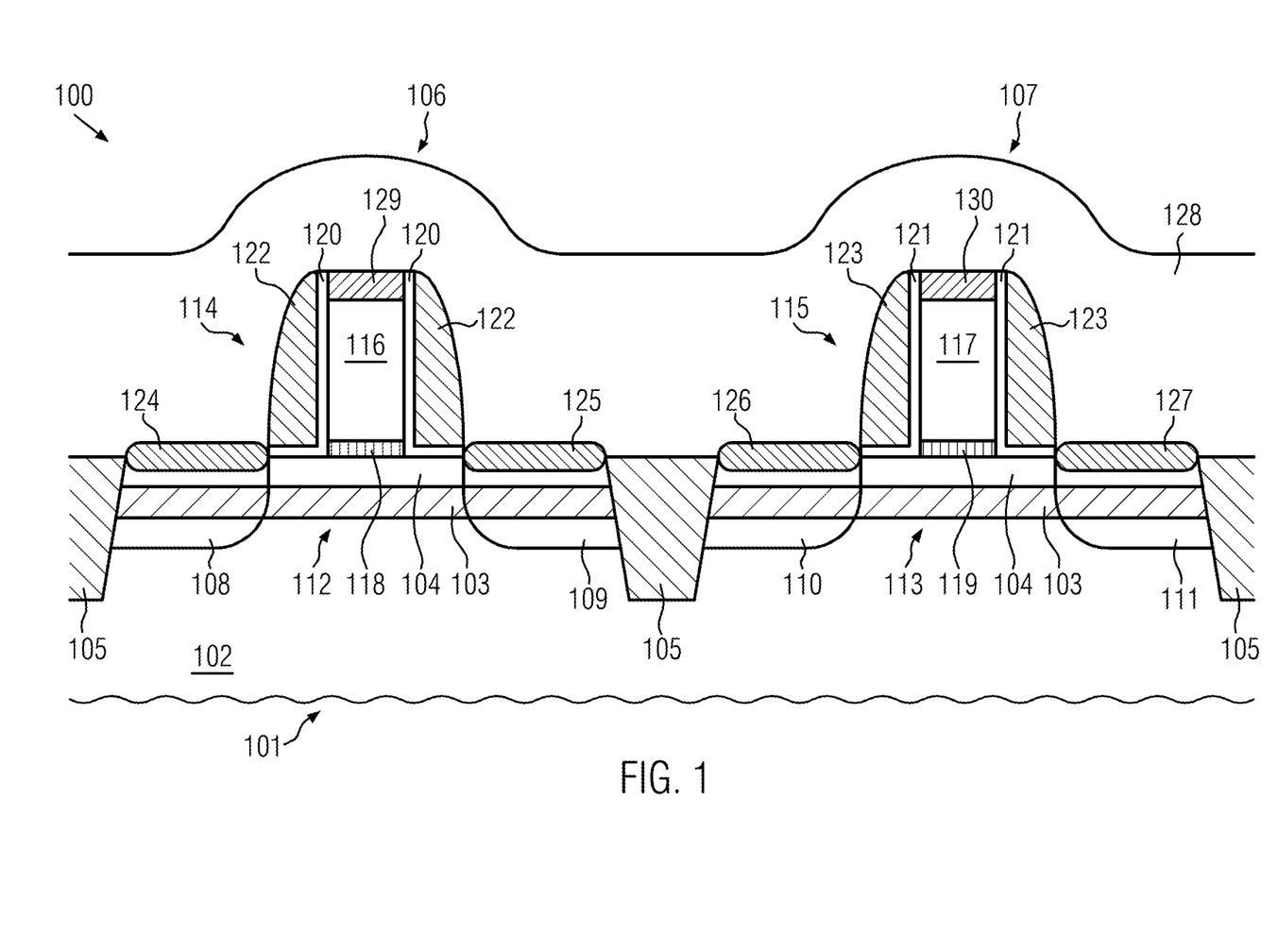
FIGS. 1-4 show schematic cross-sectional views of a device according to an embodiment in stages of a method according to an embodiment.

FIG. 1 shows a schematic cross-sectional view of a semiconductor structure 100 in a stage of a manufacturing process according to an embodiment. The semiconductor structure 100 may include a substrate 101. The substrate 101 may include a substrate base 102. The substrate base 102 may include a semiconductor material, for example, silicon. In some embodiments, the substrate base 102 may include a bulk semiconductor wafer, for example a bulk silicon wafer. In other embodiments, the substrate base 102 may include a semiconductor-on-insulator wafer wherein a layer of a semiconductor material, for example silicon, is provided on a layer of an electrically insulating material, for example silicon dioxide. The layer of electrically insulating material may be provided on a support wafer that may, for example, be a silicon wafer.

The substrate 101 may further include a first layer 103 of a first semiconductor material and a second layer 104 of a second semiconductor material. The first layer 103 of the first semiconductor material may be provided on the substrate base 102. In embodiments wherein the substrate base 102 includes a bulk semiconductor wafer, the first layer 103 of the first semiconductor material may be provided on, for example directly on, a surface of the bulk semiconductor wafer. In embodiments wherein the substrate base 102 includes a semiconductor-on-insulator structure, the first layer 103 of the first semiconductor material may be provided on, for example directly on, the semiconductor layer of the semiconductor-on-insulator structure. The second layer 104 of the second semiconductor material may be provided on, for example directly on, the first layer 103 of the first semiconductor material. The first layer 103 may have a thickness in a range from about 50-200 nm, and the second layer 104 may have a thickness in a range from about 10-80 nm.

A portion of the substrate base 102 directly below the first layer 103 of the first semiconductor material may include silicon. In embodiments wherein the substrate base 102 includes a bulk semiconductor wafer, substantially the entire substrate base 102 may be formed of silicon. In embodiments wherein the substrate base 102 includes a semiconductor-on-insulator wafer, the semiconductor layer of the semiconductor-on-insulator wafer may be a silicon layer. The silicon of the portion of the substrate base 102 directly below the first layer 103 of the first semiconductor material may include substantially pure silicon, wherein the substantially pure silicon may include a certain amount of dopants and/or other impurities.

The first layer 103 of the first semiconductor material may include a different semiconductor material than the substrate base 102. In some embodiments, the first layer 103 may include a chemical compound of silicon. In particular, the first layer 103 may include silicon/germanium. In such embodiments, the germanium content of the first layer 103, expressed as a molar fraction of germanium, may be in a range from about 20-40%. In other embodiments, the first layer 103 may include a material other than silicon/germanium. For example, the first layer 103 may include a chemical compound of silicon and an element other than germanium, for example silicon carbide. However, the present disclosure is not limited to embodiments wherein the first layer 103 includes a silicon compound. In further embodiments, the first layer 103 may include a III-V semiconductor compound, a II-VI semiconductor compound and/or substantially pure germanium.

The first semiconductor material of the first layer 103 may have a different crystal lattice constant than the material of the portion of the substrate base 102 directly adjacent the first layer 103. For example, silicon/germanium may have a greater crystal lattice constant than substantially pure silicon, and silicon carbide may have a smaller crystal lattice constant than substantially pure silicon.

The second semiconductor material of the second layer 104 may be a different material than the first semiconductor material of the first layer 103. In some embodiments, the second layer 104 and the substrate base 102, or at least the portion of the substrate base 102 directly below the first layer 103, may be formed of substantially the same material. In some of these embodiments, the second layer 104 may be formed of substantially pure silicon, wherein the term "substantially pure" may be understood such that the second semiconductor material of the second layer 104 may optionally include a certain amount of dopants that may be advertently introduced into the second layer 104 and other impurities that may be inadvertently introduced into the second layer 104 during the formation thereof, in addition to silicon.

The present disclosure, however, is not limited to embodiments wherein the second layer 104 is formed of silicon. In other embodiments, other materials may be used, for example, silicon carbide, a III-V semiconductor material and/or a II-VI semiconductor material. In some embodiments, the material of the second layer 104 may be different from the material of the portion of the substrate base 102 directly below the first layer 103.

The first layer 103 of the first semiconductor material may be an epitaxial film provided on the substrate base 102, wherein the crystal lattice of the first semiconductor material of the first layer 103 is aligned to the crystal lattice of at least a portion of the substrate base 102, in particular to the crystal lattice of the portion of the substrate base 102 directly below the first layer 103.

Due to the different lattice constants of the materials of the substrate base 102 and the first layer 103, an elastic stress may be created. Since the atoms of the first layer 103 may tend to align to the crystal lattice of the material of the substrate base 102, distances between atoms of the first layer 103 may be different from the natural crystal lattice constant of the first semiconductor material from which the first layer 103 is formed. In embodiments wherein the first layer 103 is formed of a material having a greater crystal lattice constant than the material of the substrate base 102, the first layer 103 may have an intrinsic compressive stress, and in embodiments wherein the first layer 103 is formed of a material having a smaller crystal lattice constant than the material of the substrate base 102, the first layer 103 of the first semiconductor material may have an intrinsic tensile stress.

The second layer 104 of the second semiconductor material may be an epitaxial film provided on the first layer 103 of the first semiconductor material, wherein the crystal lattice of the second semiconductor material of the second layer 104 may be aligned to the crystal lattice of the first layer 103 of the first semiconductor material.

As mentioned above, the crystal lattice of the first layer 103 of first semiconductor material may be aligned to the crystal lattice of the material of the substrate base 102 below it. Therefore, distances between atoms of the first semiconductor material of the first layer 103 may be approximately equal to distances between atoms of the material of the substrate base 102. Thus, in embodiments wherein the second layer 104 and the portion of the substrate base 102 directly below the first layer 103 are formed of substantially the same material, the second layer 104 of second semiconductor material may be substantially unstressed, or may have a relatively low elastic stress.

The semiconductor structure 100 may further include a P-channel transistor element 106 and an N-channel transistor element 107. An isolation structure 105, which may, for example, include a shallow trench isolation structure, may provide electrical insulation between the P-channel transistor element 106 and the N-channel transistor element 107, as well as between the transistor elements 106, 107 and other circuit elements (not shown) of the semiconductor structure 100.

The P-channel transistor element 106 may include a gate structure 114 that is provided above an active region of the P-channel transistor element 106. The gate structure 114 may include a dummy gate insulation layer 118 of an electrically insulating material, for example silicon dioxide, a dummy gate electrode 116 that may include polysilicon and is formed on the dummy gate insulation layer 118, and a cap layer 129 that is provided on the dummy gate electrode 116 and includes a dielectric material, for example silicon nitride. The gate structure 114 may further include a liner layer 120 that may be formed of a dielectric material such as, for example, silicon dioxide, and a sidewall spacer 122 that may be formed of a different dielectric material than the liner layer 120 such as, for example, silicon nitride.

The active region of the P-channel transistor element 106 may be provided in a portion of the substrate 101 and may include a source region 108 and a drain region 109 which are provided adjacent the gate structure 114, and a channel region 112 which is provided between the source region 108 and the drain region 109, below the gate structure 114.

In some embodiments, the source region 108 may include a source extension and the drain region 109 may include a drain extension, wherein the source and drain extensions may extend below the sidewall spacer 122 and may have a smaller depth than the source region 108 and the drain region 109. The source region 108 and the drain region 109 of the P-channel transistor element 106 may be P-doped, and the channel region 112 of the P-channel transistor element 106 may be N-doped or substantially undoped. In the source region 108 and the drain region 109, silicide regions 124, 125 may be provided.

The N-channel transistor element 107 may include a gate structure 115. Similar to the gate structure 114 of the P-channel transistor element 106, the gate structure 115 of the N-channel transistor element 107 may include a dummy gate insulation layer 119, a dummy gate electrode 117, a cap layer 130, a liner layer 121 and a sidewall spacer 123. The elements of the gate structure 115 of the N-channel transistor element 107 may be formed of substantially the same materials as the gate structure 114 of the P-channel transistor element 106.

The N-channel transistor element 107 further includes an active region provided in a portion of the substrate 101. The active region of the N-channel transistor element 107 includes a source region 110 and a drain region 111 which are provided adjacent the gate structure 115, and a channel region 113 provided between the source region 110 and the drain region 111, below the gate structure 115. Similar to the N-channel transistor element 106, the source region 110 and the drain region 111 may include a source extension and a drain extension, respectively. Moreover, in the source region 110 and in the drain region 111, silicide regions 126, 127 may be provided.

The source region 110 and the drain region 111 of the N-channel transistor element 107 may be N-doped, and the channel region 113 of the N-channel transistor element 107 may be P-doped or substantially undoped.

Above the P-channel transistor element 106 and the N-channel transistor element 107, an interlayer dielectric 128 including a dielectric material such as, for example, silicon dioxide may be provided.

At the point of the manufacturing process shown in FIG. 1, an elastic stress of the channel region 112 of the P-channel transistor element 106 and an elastic stress of the channel region 113 of the N-channel transistor element 107 may be approximately equal. In embodiments wherein the substrate base 102 and the second layer 104 of the second semiconductor material include silicon, and the first layer 103 of the first semiconductor material includes silicon/germanium, both the channel region 112 of the P-channel transistor element 106 and the channel region 113 of the N-channel transistor element 107 may have a compressive stress, provided by the compressively stressed first layer 103 as described above. While a compressive stress of the channel region 112 of the P-channel transistor element 106 may be beneficial for improving the mobility of holes in the channel region 112 of the P-channel transistor element 106, it may be less than optimal in view of the mobility of electrons in the channel region 113 of the N-channel transistor element 107.

The above-described features of the semiconductor structure 100 may be formed as follows.

The substrate base 102 may be provided in form of a bulk semiconductor wafer or a semiconductor-on-insulator wafer. The first layer 103 of the first semiconductor material and the second layer 104 of the second semiconductor material may be deposited on the substrate base 102 by means of techniques for the epitaxial deposition of layers of a semiconductor material. In particular, techniques including chemical vapor deposition, plasma enhanced chemical vapor deposition, atomic layer deposition and/or physical vapor deposition and techniques such as molecular beam epitaxy may be employed.

After the deposition of the first layer 103 and the second layer 104, the isolation structure 105 may be formed by means of techniques of forming shallow trench isolation structures including photolithography, etching, oxidation and/or deposition, and ion implantation processes may be performed for doping the active regions of the transistor elements 106, 107, wherein the doping may correspond to the desired doping of the channel regions 112, 113. The active region of the P-channel transistor element 106 may be covered by a photoresist mask during the doping of the active region of the N-channel transistor element 107, and the active region of the N-channel transistor element 107 may be covered by a photoresist mask during the doping of the active region of the P-channel transistor element 106.

Thereafter, a layer of a material of the dummy gate insulation layers 118, 119 may be formed by means of techniques of oxidation and/or deposition. On the layer of the material of the dummy gate insulation layers 118, 119, layers of materials of the dummy gate electrodes 116, 117 and the cap layers 129, 130 may be deposited by means of deposition techniques such as, for example, chemical vapor deposition, plasma-enhanced chemical vapor deposition and/or physical vapor deposition. Then, the layers of the materials of the dummy gate insulation layers 118, 119, the dummy gate electrodes 116, 117 and the cap layers 129, 130 may be patterned to form the dummy gate insulation layers 118, 119, the dummy gate electrodes 116, 117 and the cap layers 129, 130. This may be done by means of techniques of photolithography and etching.

Thereafter, ion implantation processes may be performed to form source and drain extension regions adjacent the dummy gate electrodes 116, 117. In doing so, ions of a P-type dopant may be implanted into the P-channel transistor element 106, and ions of an N-type dopant may be implanted into the N-channel transistor element 107, wherein the P-channel transistor element 106 may be covered by a photoresist mask during the implantation of ions into the N-channel transistor element 107, and the N-channel transistor element 107 may be covered by a mask during the implantation of ions into the P-channel transistor element 106. Ions impinging on the dummy gate electrodes 116, 117 may be absorbed by the dummy gate electrodes, so that the doping of the channel regions 112, 113 may remain substantially unmodified.

Then, the liner layers 120, 121 and the sidewall spacers 122, 123 may be formed. For this purpose, layers of the materials of the liner layers 120, 121 and the sidewall spacers 122, 123 may be deposited, for example, by means of techniques of chemical vapor deposition and/or plasma enhanced chemical vapor deposition. Then, an anisotropic etch process, for example a dry etch process, may be performed, wherein portions of the layer of the material of the sidewall spacers 122, 123 on substantially horizontal portions of the semiconductor structure 100 are removed, and portions of the layer at the sidewalls of the dummy gate electrodes 116, 117 remain in the semiconductor structure 100 due to the anisotropy of the etch process. In the anisotropic etch process, the layer of the material of the liner layers 120, 121 may be used as an etch stop layer.

Then, portions of the layer of the material of the liner layers 120, 121 which are not covered by the sidewall spacers 122, 123 may be removed by an etch process, which may be a wet etch process or a dry etch process, and the source regions 108, 110 and the drain regions 109, 111 may be formed by means of ion implantation processes, wherein ions of a P-type dopant are implanted into the P-channel transistor element 106, and ions of an N-type dopant are implanted into the N-channel transistor element 107. During the formation of the source region 108 and the drain region 109 of the P-channel transistor element 106, the N-channel transistor element 107 may be covered by a photoresist mask, and the P-channel transistor element 106 may be covered by a photoresist mask during the formation of the source region 110 and the drain region 111 of the N-channel transistor element 107.

Then, the silicide regions 124, 125, 126, 127 may be formed by depositing a layer of a refractory metal, such as nickel, tungsten and/or titanium, over the semiconductor structure 100 and performing an annealing process to initiate a chemical reaction between the refractory metal and the second semiconductor material of the second layer 104. Unreacted residues of the refractory metal may be removed by means of an etch process. In the annealing process that is performed for forming the silicide regions 124, 125, 126, 127 and/or in another annealing process that is additionally performed, the dopants introduced into the active regions of the transistor elements 106, 107 may be activated, so that they may provide charge carriers.

Thereafter, the interlayer dielectric 128 may be deposited by means of a chemical vapor deposition process and/or a plasma enhanced chemical vapor deposition process. In embodiments wherein the interlayer dielectric 128 includes silicon dioxide, the interlayer dielectric 128 may be formed by means of a process of chemical vapor deposition and/or plasma enhanced chemical vapor deposition, wherein tetraethyl orthosilicate (TEOS) is used as a reactant.

Figure 2:
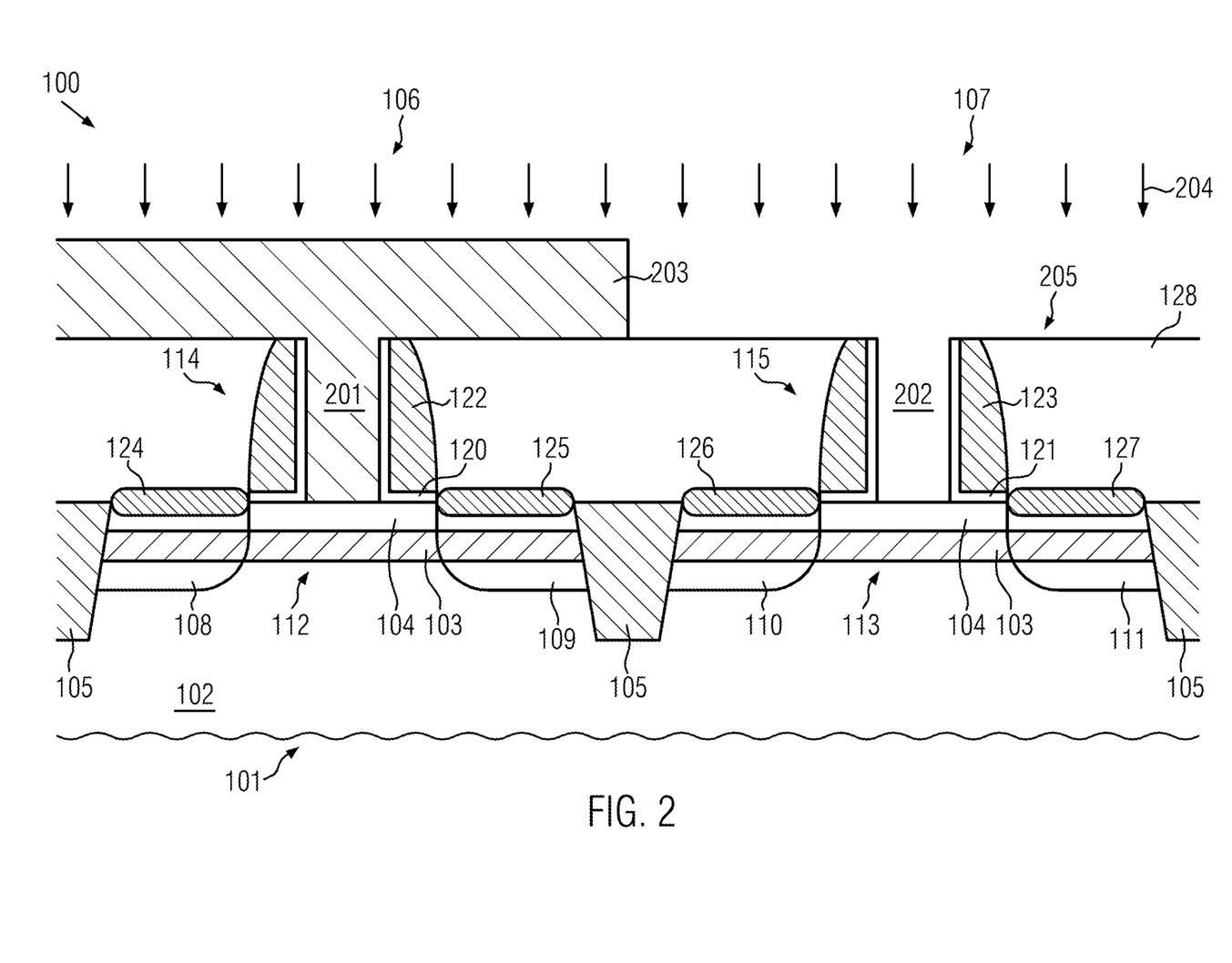

FIG. 2 shows a schematic cross-sectional view of the semiconductor structure 100 in a later stage of the manufacturing process.

After the deposition of the interlayer dielectric 128, a chemical mechanical polishing process may be performed. In the chemical mechanical polishing process, portions of the interlayer dielectric 128 above the dummy gate electrodes 116, 117 (FIG. 1) may be removed. Additionally, the cap layers 129, 130 (FIG. 1) may be removed, so that the dummy gate electrodes 116, 117 are exposed at the surface of the semiconductor structure 100, and portions of the sidewall spacers 122, 123 and the liner layers 120, 121 may also be removed. As shown in FIG. 2, in the chemical mechanical polishing process, a substantially planar surface of the interlayer dielectric 128 and the sidewall spacers 122, 123 may be obtained, in contrast to the surface of the as-deposited interlayer dielectric 128 that may have mounds above the gate structures 114, 115, as schematically depicted in FIG. 1.

After the chemical mechanical polishing process, the dummy gate electrodes 116, 117 may be removed by means of an etch process adapted to selectively remove the materials of the dummy gate electrodes 116, 117 relative to the materials of the liner layers 120, 121, the sidewall spacers 122, 123 and the interlayer dielectric 128. The etch process may be a dry etch process or a wet etch process. In the etch process for removing the dummy gate electrodes 116, 117, the dummy gate insulation layers 118, 119 may be used as etch stop layers. Thereafter, a further dry or wet etch process for removing the dummy gate insulation layers 118, 119 may be performed.

After the removal of the dummy gate electrodes 116, 117 and the dummy gate insulation layers 118, 119, the second layer 104 of the second semiconductor material may be exposed at a bottom of openings 201, 202 which are provided in an electrically insulating structure 205. The electrically insulating structure 205 may be provided by portions of the interlayer dielectric 128, the sidewall spacers 122, 123 and the liner layers 120, 121 which were not removed in the chemical mechanical polishing process described above.

As detailed above, the liner layers 120, 121 and the interlayer dielectric 128 may include silicon dioxide, and the sidewall spacers 122, 123 may include silicon nitride. Thus, the electrically insulating structure 205 may include portions which are formed of different materials. In particular, the electrically insulating structure 205 may include silicon nitride portions provided by the sidewall spacers 122, 123, which are located adjacent the openings 201, 202 of the electrically insulating structure 205.

The opening 201 of the electrically insulating structure 205 is provided at the location of the dummy gate electrode 116 of the P-channel transistor element 106. Thus, the opening 201 is located above the channel region 112 of the P-channel transistor element 106.

The opening 202 of the electrically insulating structure 205 is located at the location of the dummy gate electrode 117 of the N-channel transistor 107. Accordingly, the opening 202 of the electrically insulating structure 205 is located above the channel region 113 of the N-channel transistor 107.

After the formation of the openings 201, 202 in the electrically insulating structure 205, a mask 203 may be formed. The mask 203 may cover the P-channel transistor element 106, or at least portions thereof. In particular, the mask 203 may cover the opening 201 that is provided above the channel region 112 of the P-channel transistor 106.

The mask 203 does not cover the N-channel transistor element 107 or at least portions thereof. In particular, the mask 203 does not cover the opening 202 provided above the channel region 113 of the N-channel transistor element 107. Accordingly, after the formation of the mask 203, a portion of the second layer 104 of the second semiconductor material at the channel region 113 of the N-channel transistor element 107 is exposed at the surface of the semiconductor structure 100. The portion of the second layer 104 of the second semiconductor material above the channel region 112 of the P-channel transistor element 106 is not exposed, but is covered by the mask 203.

After the formation of the mask 203, an ion implantation process that is schematically denoted by arrows 204 in FIG. 2 may be performed. In the ion implantation process 204, the semiconductor structure 100 may be irradiated with ions of a noble gas. In some embodiments, in the ion implantation process 204, the semiconductor structure 100 may be irradiated with helium ions. However, the present disclosure is not limited to embodiments wherein the semiconductor structure 100 is irradiated with helium ions in the ion implantation process 204. In other embodiments, noble gases other than helium may be employed. In particular, the semiconductor structure 100 may be irradiated with ions of a noble gas having a smaller atomic weight than xenon, for example, krypton, argon and/or neon.

In some embodiments, in the ion implantation process 204, the semiconductor structure 100 may be irradiated with helium ions, wherein the helium ions may have an energy in a range from about 80-200 keV. A dose of the helium ions may be in a range from about $10^{15}$-$10^{16}$ atoms/cm$^2$.

In the ion implantation process 204, ions may penetrate portions of the channel region 113 of the N-channel transistor 107 that are exposed at the bottom of the opening 202 in the electrically insulating structure 205. Due to the interaction between the ions and the atoms of the channel region 113, the ions may lose energy, and, finally, come to rest within the channel region 113 of the N-channel transistor element 107 and be electrically neutralized. The distance the ions travel through the channel region 113 before they come to rest can depend on the type of ions used in the ion implantation process 204, the energy of the ions and the materials of the substrate base 102, the first layer 103 of the first semiconductor material and the second layer 104 of the second semiconductor material.

The number of interactions of an ion with atoms of the channel region 113, and the loss of energy in each interaction between the ion and an atom of the channel region 113 may have a certain degree of randomness, so that ions of substantially the same energy impinging on the surface of the second layer 104 of the second semiconductor material exposed at the bottom of the opening 202 may come to rest at different distances from that surface. Thus, in the ion implantation process 204, a depth distribution of the noble gas that is implanted into the channel region 113 of the N-channel transistor element 107 may be obtained.

The depth distribution may have a maximum, corresponding to a distance from the surface of the second layer 104 of the second semiconductor material, at which most of the ions irradiated to the channel region 113 of the N-channel transistor element 107 in the ion implantation process 204 come to rest. In the following, the distance between the maximum of the depth distribution of the ions of the noble gas in the ion implantation process 204 and the surface of the second layer 104 of the second semiconductor material, measured along a thickness direction of the substrate 101 that is perpendicular to a surface of the substrate 101 at which the transistor elements 106, 107 are formed, will be denoted as implantation depth of the ions of the noble gas.

The implantation depth of the ions of the noble gas in the ion implantation process 204 may be greater than a sum of a thickness of the first layer 103 of the first semiconductor material and a thickness of the second layer 104 of the second semiconductor material. Accordingly, the maximum of the depth distribution of the implanted noble gas, as obtained directly after the ion implantation process 204, may be below the first layer 103 of the first semiconductor material, i.e., within the substrate base 102.

In other embodiments, the implantation depth of the ions of the noble gas in the ion implantation process 204 may be smaller than the sum of the thicknesses of the first layer 103 of the first semiconductor material and the second layer 104 of the second semiconductor material, and greater than the thickness of the second layer 104. Thus, the maximum of the depth distribution of the as-implanted noble gas may be obtained within the first layer 103 of the first semiconductor material.

Ions of the noble gas irradiated to the semiconductor structure 100 in the ion implantation process 204 that impinge on the electrically insulating structure 205 and/or the mask 203 may be absorbed by the electrically insulating structure 205 and/or the mask 203. Thus, the ions of the noble gas may be selectively implanted into the channel region 113 of the N-channel transistor element 107. In particular, substantially no ions of the noble gas are implanted into the source 108, drain 109 and channel 112 regions of the P-channel transistor element 106 and into the source region 110 and the drain region 111 of the N-channel transistor element 107.

Figure 3:
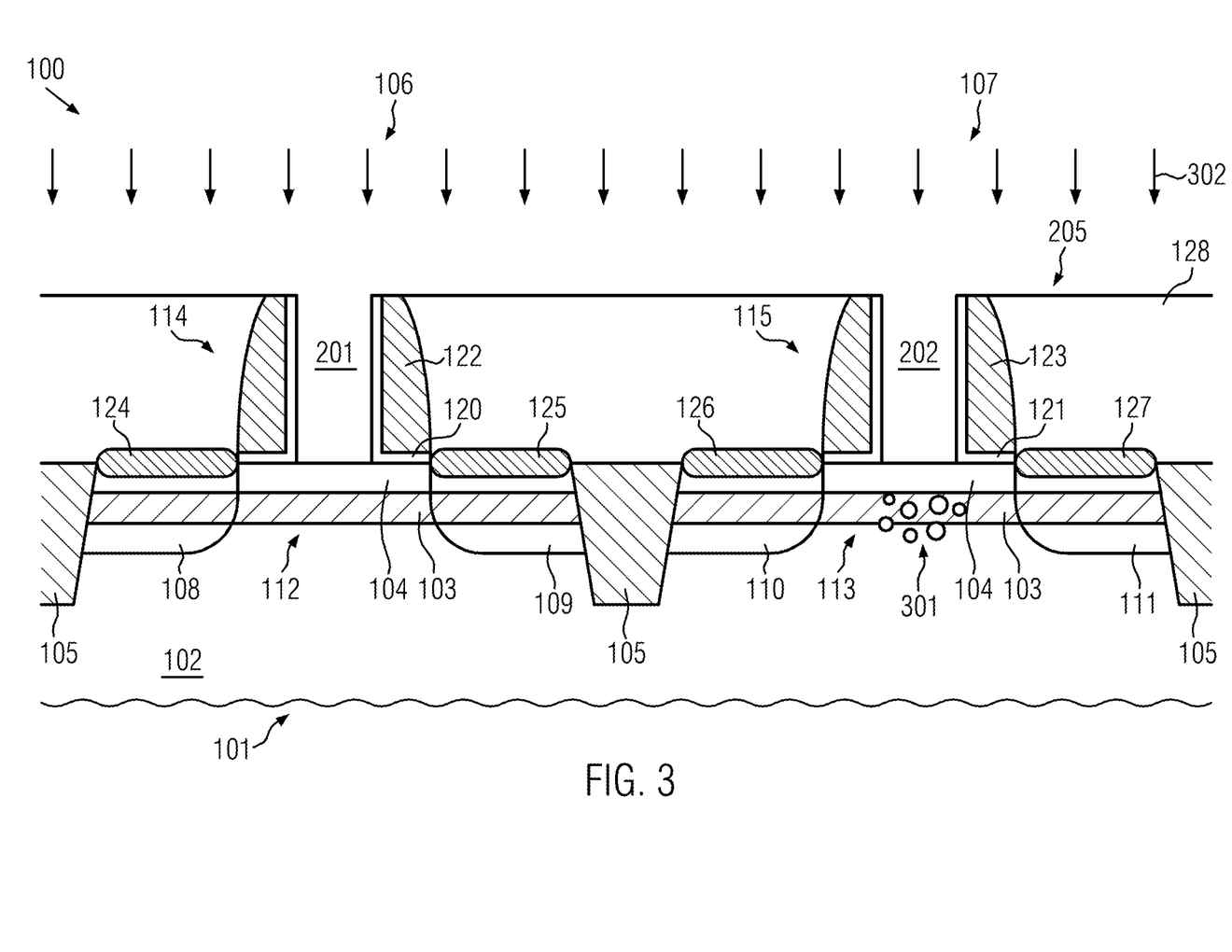

FIG. 3 shows a schematic cross-sectional view of the semiconductor structure 100 in a later stage of the manufacturing process.

After the ion implantation process 204, the mask 203 may be removed, for example, by means of a photoresist strip process, and an annealing process may be performed, as schematically denoted by arrows 302 in FIG. 3. The annealing process 302 may be an ultra-fast annealing process, for example, a laser annealing process. In other embodiments, the annealing process 302 may be a flash lamp annealing process. In a laser annealing process or flash lamp annealing process, the semiconductor structure 100 may be exposed to a relatively high temperature for a relatively short time. This may help to reduce a diffusion of dopants such as, for example, dopants in the source regions 108, 110 and the drain regions 109, 111 of the transistor elements 106, 107. In the annealing process 302, the semiconductor structure 100 may be exposed to a temperature in a range from about 900-1200° C., and the annealing process 302 may have a duration in a range from about 1 millisecond to about 2 seconds, in particular from about 1 millisecond to about 1 second.

In the annealing process 302, the helium atoms introduced into the channel region 113 of the N-channel transistor element 107 in the ion implantation process 204 may segregate, so that the helium atoms can rearrange and form micro holes that may disturb the crystal lattice of the portion of the substrate base 102 and/or the portion of the first layer 103 of the first semiconductor material in the channel region 113 of the N-channel transistor element 107. In FIG. 3, the micro holes are schematically illustrated and denoted by reference numeral 301, wherein the number and size of the micro holes 301 shown in FIG. 3 are of a schematic nature only and need not be representative of the number and/or size of the micro holes obtained in an actual implementation. The presence of the micro holes 301 in the crystal lattice of the substrate base 102 and/or the first layer 103 of the first semiconductor material can allow the first layer 103 of the first semiconductor material to relax from its stressed state by formation of some dislocation defects. Accordingly, distances between atoms of the first layer 103 of the first semiconductor material may relax towards the natural crystal lattice constant of the first semiconductor material from which the first layer 103 is formed and/or the atoms of the first layer 103 may arrange at distances that are substantially in conformity with the natural crystal lattice constant of the first semiconductor material. Thus, the elastic stress initially provided by the first layer 103 of the first semiconductor material in the channel region 113 of the N-channel transistor element 107 may be relaxed and/or substantially removed.

The alteration of the distances between the atoms of the first semiconductor material in the first layer 103 may have an influence on the second layer 104 of the second semiconductor material. The second layer 104 of the second semiconductor material, which, as detailed above, may have been substantially unstressed initially, may obtain an elastic stress as a result of the relaxation of the underlying first layer 103 of the first semiconductor material. In particular, in embodiments wherein the second layer 104 of the second semiconductor material and the substrate base 102 are formed of substantially the same semiconductor material, the elastic stress of the second layer 104 of the second semiconductor material obtained after the relaxation of the elastic stress of the first layer 103 may be opposite to the initial elastic stress of the first layer 103. In embodiments wherein the initial stress of the first layer 103 of semiconductor material was compressive, which, as detailed above, may be obtained, in particular, in embodiments wherein the first layer 103 includes silicon/germanium and the substrate base 102 as well as the second layer 104 include silicon, after the annealing process 302, a tensile stress of the second layer 104 of the second semiconductor material may be obtained.

Figure 5:
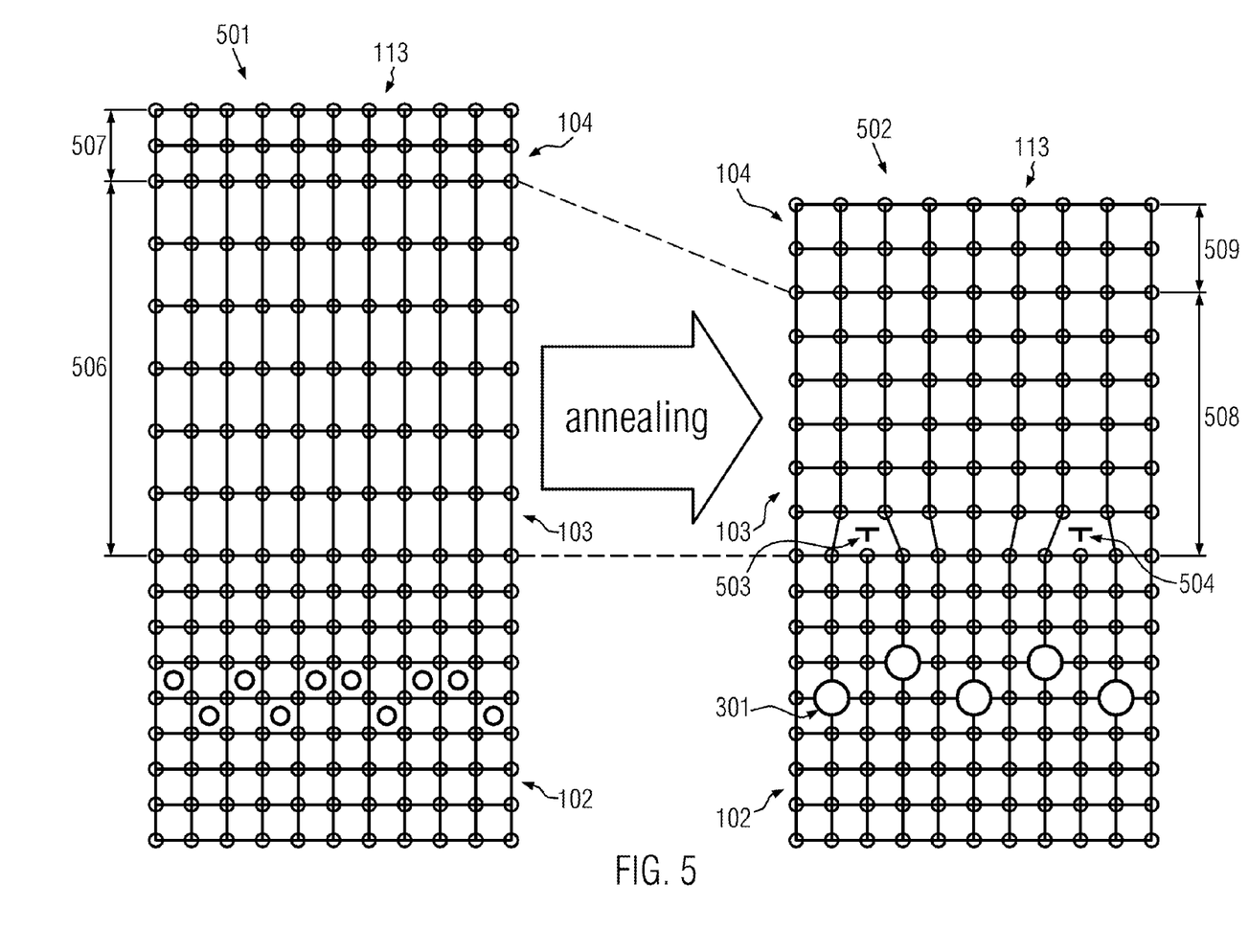
FIG. 5 schematically illustrates an influence of an ion implantation process and an annealing process on a stress configuration of semiconductor layers in a device according to an embodiment.

The influence of the annealing process 302 on the first layer 103 of first semiconductor material and the second layer 104 of second semiconductor material is schematically illustrated in more detail in FIG. 5.

In FIG. 5, a left portion 501 of the figure schematically illustrates portions of the substrate base 102, the first layer 103 of the first semiconductor material and the second layer 104 of the second semiconductor material in the channel region 113 of the N-channel transistor element 107 before the annealing process 302. The configuration of the same portion of the channel region 113 obtained after the annealing process 302 is schematically illustrated in the right portion 502 of the FIG. 5. Due to the formation of the micro holes 301 in the substrate base 102, dislocations 503, 504 may be formed, wherein the dislocations 503, 504 may be located, for example, at the interface between the substrate base 102 and the first layer 103 of the first semiconductor material and/or in the vicinity thereof. In some embodiments, dislocation at other positions may also be obtained.

As shown in the left portion 501 of FIG. 5, before the annealing process 302, a distance between the atoms of the first layer 103 of the first semiconductor material in a horizontal direction that is substantially parallel to the surface of the substrate 101 at which the transistor elements 106, 107 are formed may be approximately equal to the distance between atoms of the substrate base 102 in the horizontal direction, corresponding to the compressively stressed configuration of the first layer 103 of the first semiconductor material in embodiments wherein the first semiconductor material has a greater crystal lattice constant than the material of the substrate base 102.

As shown in the right portion 502 of FIG. 5, due to the formation of the dislocations 503, 504, after the annealing process 302, the atoms of the first layer 103 of the first semiconductor material may arrange at a greater distance in the horizontal direction, in accordance with the natural lattice constant of the first semiconductor material from which the first layer 103 is formed which, in the example shown in FIG. 5, is greater than the lattice constant of the material of the substrate base 102.

At the same time, the distance between the atoms of the second layer 104 of the second semiconductor material may increase, corresponding to the creation of a tensile stress in the second layer 104 of the second semiconductor material.

In FIG. 5, reference numeral 506 denotes a thickness of the first layer 103 of the first semiconductor material before the annealing process 302, and reference numeral 507 denotes a thickness of the second layer 104 of the second semiconductor material before the annealing process 302. Reference numeral 508 denotes a thickness of the first layer 103 of the first semiconductor material after the annealing process 302, and reference numeral 509 denotes a thickness of the second layer 104 of the second semiconductor material after the annealing process 302.

As shown in FIG. 5, the relaxation of the elastic stress of the first layer 103 of the first semiconductor material may have an influence on the thicknesses of the layers 103, 104. In particular, a slight reduction of the thickness of the first layer 104 of the first semiconductor material and/or a slight increase of the thickness of the second layer 104 of the second semiconductor material may be obtained, wherein the changes of the thicknesses of the layers 103, 104 are shown in an exaggerated manner in FIG. 5.

Since substantially no ions of the noble gas were implanted into the channel region 112 of the P-channel transistor element 106, the elastic stress in the portion of the first layer 103 of the first semiconductor material in the P-channel transistor element 106 may remain substantially unaffected by the annealing process 302 or, at least, may be affected by the annealing process 302 to a substantially smaller extent than the elastic stress in the channel region 113 of the N-channel transistor region 107.

Thus, a compressive stress may be maintained in the channel region 112 of the P-channel transistor element 106, and a tensile stress may be obtained in the channel region 113 of the N-channel transistor element 107, which may provide an improvement of the mobility of electrons in the channel region 113 of the N-channel transistor element 107, although layers of substantially the same semiconductor materials are provided in the channel regions 112, 113 of the P-channel transistor element 106 and the N-channel transistor element 107. Apart from having a different elastic stress, the channel regions 112, 113 of the P-channel transistor element 106 and the N-channel transistor element 107 may have different lattice dislocation densities and/or different concentrations of the noble gas used in the ion implantation process 204. In particular, in the channel region 113 of the N-channel transistor element 107, a greater amount of the noble gas and/or a greater density of lattice dislocations may be present than in the channel region 112 of the P-channel transistor element 106.

Figure 4:
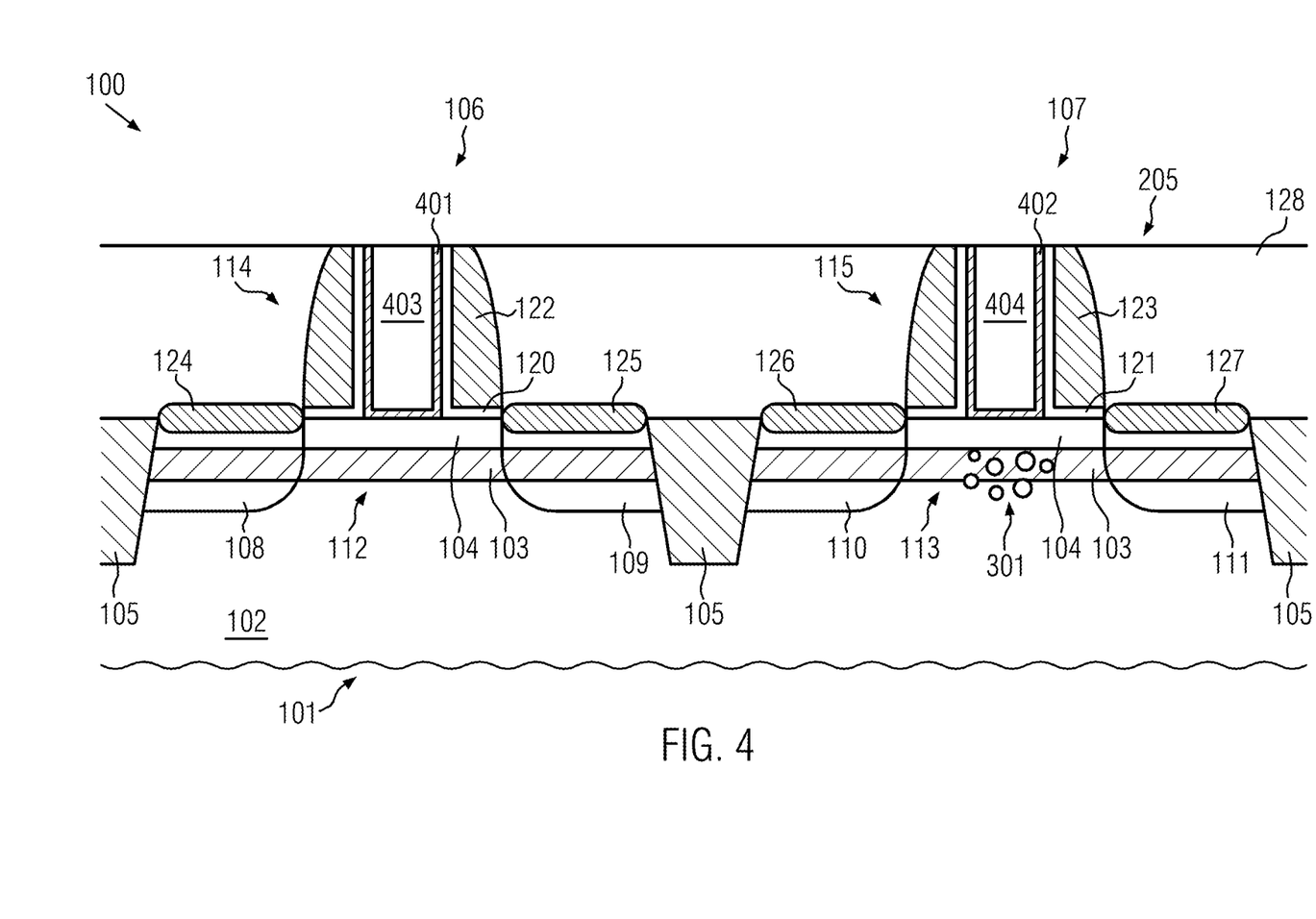

FIG. 4 shows a schematic cross-sectional view of the semiconductor structure 100 in a later stage of the manufacturing process.

After the annealing process 302, a gate insulation layer 401 and a gate electrode 403 may be formed in the opening 201 (FIG. 3) above the channel region 112 of the P-channel transistor element 106, and a gate insulation layer 402 and a gate electrode 404 may be formed in the opening 202 (FIG. 3) above the channel region 113 of the N-channel transistor element 107. The gate insulation layers 401, 402 and the gate electrodes 403, 404 may substantially completely fill the openings 201, 202. Accordingly, sizes of the gate electrodes 403, 404 may approximately correspond to sizes of the openings 201, 202 of the electrically insulating layers 205.

The formation of the gate insulation layers 401, 402 and the gate electrodes 403, 404 may be performed in accordance with conventional high-k metal gate technologies, including processes of depositing layers of materials of the gate insulation layers 401, 402 and the gate electrodes 403, 404, processes of photolithography and etching that may be employed for providing different materials of the gate electrodes, and processes of chemical mechanical polishing for removing portions of the layers of the materials of the gate insulation layers 401, 402 and the gate electrodes 403, 404 outside the openings 201, 202. The gate electrodes 403, 404 of the P-channel transistor element 106 and the N-channel transistor element 107 may include different materials, which may be selected in accordance with work function requirements of the P-channel transistor element 106 and the N-channel transistor element 107.

In some embodiments, the gate insulation layers 401, 402 may include a high-k dielectric material such as, for example, hafnium dioxide and/or hafnium silicon oxynitride. The gate electrode 403 of the P-channel transistor element 106 may include aluminum, aluminum nitride and/or titanium nitride, and the gate electrode 404 of the N-channel transistor element 107 may include lanthanum, lanthanum nitride and/or titanium nitride. For providing different materials of the gate electrodes 403, 404 of the transistor elements 106, 107, conventional techniques of photolithography and etching may be employed.

After the formation of the gate insulation layers 401, 402 and the gate electrodes 403, 404, the P-channel transistor element 106 provides a substantially complete P-channel field effect transistor, and the N-channel transistor element 107 provides a substantially complete N-channel field effect transistor.

Further process steps performed at the semiconductor structure 100 may include a deposition of layers of interlayer dielectric materials over the semiconductor structure 100, a formation of electrical contacts to the transistor elements 106, 107 and/or a formation of interconnecting electrically conductive lines, as well as further back end of line processes. These process steps can be performed in accordance with conventional techniques for the formation of semiconductor structures.

The present disclosure is not limited to embodiments wherein the ions of the noble gas are implanted into the channel region 113 of the N-channel transistor element 107. In other embodiments, during the ion implantation process 204, the N-channel transistor element 107 may be covered by a mask similar to mask 203 shown in FIG. 2, and the second layer 104 of the second semiconductor material may be exposed at the bottom of the opening 201 that is located over the channel region 112 of the P-channel transistor element 106. Thus, in the ion implantation process 204, ions of the noble gas are selectively implanted into the channel region 112 of the P-channel transistor element 106, and substantially no ions of the noble gas are implanted into the channel region 113 of the N-channel transistor element 107. Thus, in a subsequent annealing process similar to annealing process 302 described above, the elastic stress of the channel region 112 of the P-channel transistor element 106 may be modified, and the elastic stress of the channel region 113 of the N-channel transistor element 107 may remain substantially unaffected. This may be particularly helpful in embodiments wherein the first layer 103 of the first semiconductor material includes a semiconductor material having a smaller lattice constant than the materials of the substrate base 102 and the second layer 104 of the second semiconductor material. In such embodiments, initially, a tensile stress may be present in the channel regions 112, 113 of the transistor elements 106, 107, wherein the tensile stress may be provided by the first layer 103 of the first semiconductor material. Due to the implantation of ions of a noble gas into the channel region 112 of the P-channel transistor element 106 and the subsequent annealing process, the tensile stress of the first layer 103 of the first semiconductor material may be relaxed, and a compressive stress may be provided in the channel region 112 of the P-channel transistor element 106 by the second layer 104 of the second semiconductor material that may become stressed when the elastic stress of the first layer 103 is relaxed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate comprising a substrate base, a first layer of a first semiconductor material formed on said substrate base, and a second layer of a second semiconductor material formed on said first layer, wherein said first semiconductor material and said second semiconductor material have different crystal lattice constants and at least an uppermost portion of said substrate base comprises a third semiconductor material layer;
   after providing said substrate comprising said substrate base and said first and second layers, forming an isolation structure through said second layer and at least a portion of said first layer so as to define a first active region of a first transistor;
   after forming said isolation structure, forming an electrically insulating structure having a first opening over said substrate, wherein said electrically insulating structure covers at least a portion of said first active region;
   implanting ions of a noble gas into an exposed portion of said first active region through said first opening of said electrically insulating structure; and
   forming a gate electrode of said first transistor in said first opening of said electrically insulating structure.

2. The method of claim 1, wherein at least a portion of said ions of said noble gas is implanted into at least one of said third semiconductor material layer of said substrate base and said first layer of said first semiconductor material.

3. The method of claim 2, wherein a maximum of the depth distribution of the as-implanted noble gas is within said first layer of said first semiconductor material.

4. The method of claim 2, wherein a maximum of the depth distribution of the as-implanted noble gas is within said third semiconductor material layer of said substrate base.

5. The method of claim 1, further comprising performing an annealing process after implanting said ions of said noble gas and before forming said gate electrode.

6. The method of claim 5, wherein said annealing process comprises at least one of laser annealing and flash lamp annealing.

7. The method of claim 1, wherein said noble gas is helium.

8. The method of claim 1, wherein forming said electrically insulating structure having said first opening comprises:
   forming a gate structure comprising a dummy gate insulation layer, a dummy gate electrode formed above said dummy gate insulation layer, and a sidewall spacer formed adjacent said dummy gate electrode;
   depositing a layer of an interlayer dielectric over said gate structure;
   performing a chemical mechanical polishing process, said chemical mechanical polishing process exposing said dummy gate electrode; and
   removing said dummy gate electrode and said dummy gate insulation layer so as to form said first opening and expose a surface of said second layer, wherein said layer of said interlayer dielectric and said sidewall spacer comprise said electrically insulating structure.

9. The method of claim 1, wherein said third semiconductor material layer of said substrate base comprises silicon, said first semiconductor material comprises silicon/germanium and said second semiconductor material comprises silicon.

10. The method of claim 1, wherein said first layer of said first semiconductor material comprises silicon/germanium with a germanium concentration in a range from about 20-40% and has a thickness in a range from about 50-200 nm, and said second layer of said second semiconductor material has a thickness in a range from about 10-80 nm.

11. The method of claim 1, wherein said ions of said noble gas have an energy in a range from about 80-200 keV, and a dose of said ions of said noble gas in a range from about $10^{15}$-$10^{16}$ atoms/cm$^2$.

12. The method of claim 1, wherein forming said gate electrode of said first transistor comprises depositing a layer of a gate insulation material and a layer of at least one gate electrode material over said substrate and removing portions of said layer of said gate insulation material and said layer of said at least one gate electrode material formed outside said first opening.

13. The method of claim 12, wherein said gate insulation material comprises a high-k material and said at least one gate electrode material comprises a metal.

14. The method of claim 1, wherein said electrically insulating structure covers at least a portion of a second active region of a second transistor defined by said isolation structure and has a second opening that exposes an upper surface of said second layer in said second active region, the method further comprising forming a gate electrode of a second transistor in said second opening of said electrically insulating structure, wherein said second opening is covered by a mask while implanting said ions of said noble gas through said first opening, and wherein one of said first transistor and said second transistor is an N-channel transistor and the other of said first transistor and said second transistor is a P-channel transistor.

15. The method of claim 14, wherein said first transistor is an N-channel transistor and said second transistor is a P-channel transistor.

16. The method of claim 1, wherein said isolation structure extends through said first layer and into said third semiconductor material layer of said substrate base.

17. The method of claim 1, wherein said noble gas has a smaller atomic weight than xenon.

18. A method, comprising:
forming a first semiconductor material layer having a first crystal lattice constant on a base semiconductor material layer of a semiconductor substrate;
forming a second semiconductor material layer having a second crystal lattice constant on said first semiconductor material layer, wherein said second crystal lattice constant is different from said first crystal lattice constant;
after forming said second semiconductor material layer, forming an isolation structure that extends at least into said first semiconductor material layer to define an active region of a semiconductor device;
forming a dummy gate structure above said active region, said dummy gate structure comprising a dummy gate insulation layer and a dummy gate electrode formed above said dummy gate insulation layer;
forming a spacer structure adjacent to sidewalls of said dummy gate structure;
forming an interlayer dielectric material above and around said dummy gate structure, said spacer structure and said interlayer dielectric material covering a first portion of said second semiconductor material layer of said active region;
removing said dummy gate structure selectively to said spacer structure and said interlayer dielectric material so as to form an opening defined by inner sidewalls of said spacer structure, said opening exposing a second portion of said second semiconductor material layer of said active region;
performing an ion implantation process to implant ions of a noble gas into said exposed second portion of said active region through said opening, said noble gas having a smaller atomic weight than xenon; and
after performing said ion implantation process, forming a replacement gate structure in said opening.

19. The method of claim 18, wherein a portion of said noble gas ions are implanted into said base semiconductor material layer.

20. A method, comprising:
forming a first layer of semiconductor material on and in contact with a base semiconductor material layer of a semiconductor substrate;
forming a second layer of semiconductor material on and in contact with said first layer, said first and second layers of semiconductor material having different crystal lattice constants;
after forming said second layer, forming an isolation structure that extends through said first and second layers and into said base semiconductor material layer, said isolation structure defining first and second active regions;
forming first and second dummy gate structures above said respective first and second active regions, each of said first and second dummy gate structures comprising a dummy gate insulation layer and a dummy gate electrode formed above said dummy gate insulation layer;
forming a spacer structure adjacent to sidewalls of each of said first and second dummy gate structures;
forming an interlayer dielectric material above and around said first and second dummy gate structures, said interlayer dielectric material covering first portions of said first and second active regions;
forming first and second gate openings above said respective first and second active regions by selectively removing said first and second dummy gate structures relative to said spacer structures and said interlayer dielectric material, said first and second gate openings exposing second portions of said first and second active regions;
forming a patterned implantation mask covering said second active region and exposing said first active region, said patterned implantation mask filling said second gate opening; and
implanting helium ions into said exposed second portion of said first active region through said first gate opening while covering said first active region with said implantation mask, wherein a portion of said helium ions are implanted adjacent an interface between said first layer and said base semiconductor material layer.

21. The method of claim 20, further comprising forming a gate structure of an N-channel transistor in said first gate opening and forming a gate structure of a P-channel transistor in said second gate opening.

* * * * *